United States Patent [19]
Jeong

[11] Patent Number: 6,122,202
[45] Date of Patent: Sep. 19, 2000

[54] CASB BUFFER CIRCUIT OF SEMICONDUCTOR MEMORY DEVICE

[75] Inventor: Cheol-Woo Jeong, Seoul, Rep. of Korea

[73] Assignee: Hyundai Electronics Industries Co., Ltd., Kyoungki-do, Rep. of Korea

[21] Appl. No.: 08/881,954

[22] Filed: Jun. 25, 1997

[30] Foreign Application Priority Data

Jun. 29, 1996 [KR] Rep. of Korea ...................... 96-26292

[51] Int. Cl.[7] .................................................. G11C 29/00
[52] U.S. Cl. ................................. 365/189.05; 365/230.06
[58] Field of Search ........................ 365/189.05, 230.06, 365/190, 189.01

[56] References Cited

U.S. PATENT DOCUMENTS

| | | | |
|---|---|---|---|
| 5,475,646 | 12/1995 | Ogihara | 365/222 |
| 5,568,433 | 10/1996 | Kumar | 365/230.06 |
| 5,627,787 | 5/1997 | McClure | 365/230.06 |
| 5,663,917 | 9/1997 | Oka et al. | 365/230.06 |

*Primary Examiner*—Vu A. Le
*Attorney, Agent, or Firm*—Ware, Fressola, Van Der Sluys & Adolphson

[57] ABSTRACT

Disclosed is a buffer circuit of a semiconductor memory device having input means for receiving an input signal externally applied by an external control signal and output means for outputting the input signal of the input means as a writing control signal through an output means, including: switching means connected to the input means, and for switching the signal transmission from the input means to the output means according to first and second internal control signals; a latch means for latching an output signal from the switching means; and a pulse generator for receiving the output signal of the latch means and the external control signal and outputting the first and second internal control signals for controlling the switching means.

3 Claims, 5 Drawing Sheets

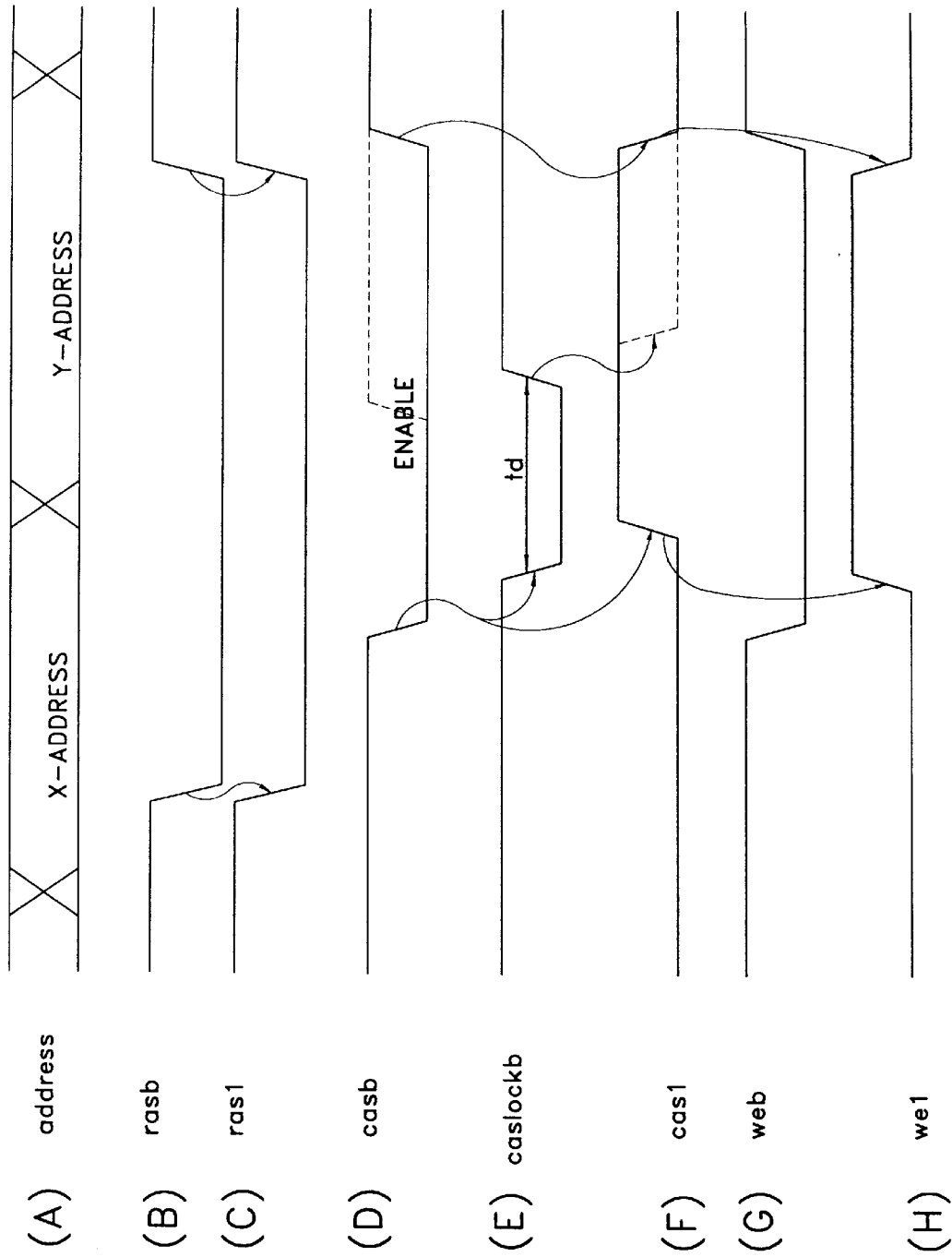

CASB BUFFER CIRCUIT OF SEMICONDUCTOR MEMORY DEVICE

BACKGROUND OF THE INVENTION

1. Field of the Invention

The present invention relates to a column address strobe (CASB) circuit, and more particularly, to a CASB buffer circuit ensuring a stable writing operation even in the case where a casb signal has a narrow pulse width.

2. Discussion of Related Art

In semiconductor memory devices, in case of writing data in a memory cell, a writing enable signal web is at a low state only if a casb signal is at a low state for a predetermined time, for purpose of writing data in a memory cell. If the low state is only maintained for a short time due to the casb signal being of insufficient duration, the data writing operation with a writing enable signal web is interrupted or stopped short as the writing enable signal returns to a high state before the data can fully written in the memory cell. Accordingly, in such a case, a casb signal having a narrow pulse width generates an error in the writing operation and thus, the data cannot be stably written in the memory cell.

FIG. 1 is a circuit diagram of a conventional CASB buffer circuit. The conventional CASB buffer circuit includes an input means for inputting a casb signal, and an output means for receiving the casb signal and then outputting a casb signal.

The input means includes a first P type MOS transistor 11 having a gate for externally receiving an inverse power-up signal pwrupb; an inverter including a second P type MOS transistor 12 and first and second N type MOS transistors 13 and 14 having a gate for externally receiving an inverse cas signal casb; and an inverting gate 16 for inverting an output signal from the inverter.

The output means includes an inverting gate 18 for inverting an output signal of the inverting gate 16 and generating a first cas signal cas1; and additional inverting gates, 19–21, for inverting the output signal of the inverting gate 16 and generating a second cas signal cas2.

As illustrated in FIG. 1, the input means of the conventional CASB buffer circuit further includes a third N type MOS transistor 15 connected in parallel to the first N type MOS transistor 13, having a gate which receives an output signal of the inverting gate 16 to protect the inverting gates 16–21 in a case where the casb signal applied to the gate is above a predetermined voltage; and a fourth N type MOS transistor 17 having a drain connected to an output terminal of the inverter 16 and a gate for receiving an inverse power-up signal pwrupb.

Operation of the thus-structured conventional CASB buffer circuit will be described with reference to FIGS. 2A to 2G.

If an address addr is externally applied, as shown in FIG. 2A, and the rasb signals are "LOW", as shown in FIGS. 2B and 2C, thus selecting an X-address, namely, the row address, the casb signal is at an active-low state, as shown in FIG. 2D.

The first P type MOS transistor 12 is turned on by the casb signal, so that an output of the inverting gate 16 becomes LOW. Accordingly, the cas1 signal output through the inverting gate 18 becomes HIGH, as shown in FIG. 2E.

If the writing enable signal web becomes active LOW as shown in FIG. 2F to perform the writing operation, the we1 signal becomes HIGH as in FIG. 2G. When the we1 signal becomes HIGH while the web signal is at the active-low state, the data is written in the externally applied address.

As described above, the conventional CASB buffer circuit enables the cas1 to be HIGH by the casb signal during the writing operation, thus controlling the we1 signal. Therefore, if the we1 signal becomes HIGH, the writing operation is performed, and if it becomes LOW, the writing operation is stopped.

In short, the conventional CASB buffer circuit of a semiconductor memory device inputs the casb signal, delays it through the inverting gate and generates the cas1 signal. If, however, the applied casb signal has a narrow pulse width and thus maintains a low state for insufficient amount of time, in particular, for a page cycle having a short cycle rate, the writing enable signal web becomes HIGH before the data can be fully written in the designated address.

SUMMARY OF THE INVENTION

Accordingly, the present invention is directed to a CASB buffer circuit of a semiconductor memory device that substantially obviates one or more of the problems due to limitations and disadvantages of the related art.

An object of the present invention is to provide a CASB buffer circuit for a semiconductor memory device which can prevent writing error by maintaining a casb signal for a predetermined time during a writing enable operation if a casb signal having a narrow pulse width is applied thereto.

To achieve these and other advantages in accordance with the purpose of the present invention, as embodied and broadly described, a buffer circuit of a semiconductor memory device having input means for receiving an input signal externally applied by an external control signal and output means for outputting the input signal of the input means as a writing control signal through an output means, includes:

a switching means connected to the input means for switching the signal transmission from the input means to the output means according to first and second internal control signals;

a latch means for latching an output signal from the switching means; and a pulse generator for receiving the output signal of the latch means and the external control signal and outputting the first and second internal control signals for controlling the switching means.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention, wherein:

FIGS. 5A to 5H are operational timing diagrams of the CASB buffer of a semiconductor memory device according to the present invention.

DETAILED DESCRIPTION OF PREFERRED EMBODIMENT

Reference will now be made in detail to the preferred embodiments of the present invention, examples of which are illustrated in the accompanying drawings.

Figure 3:
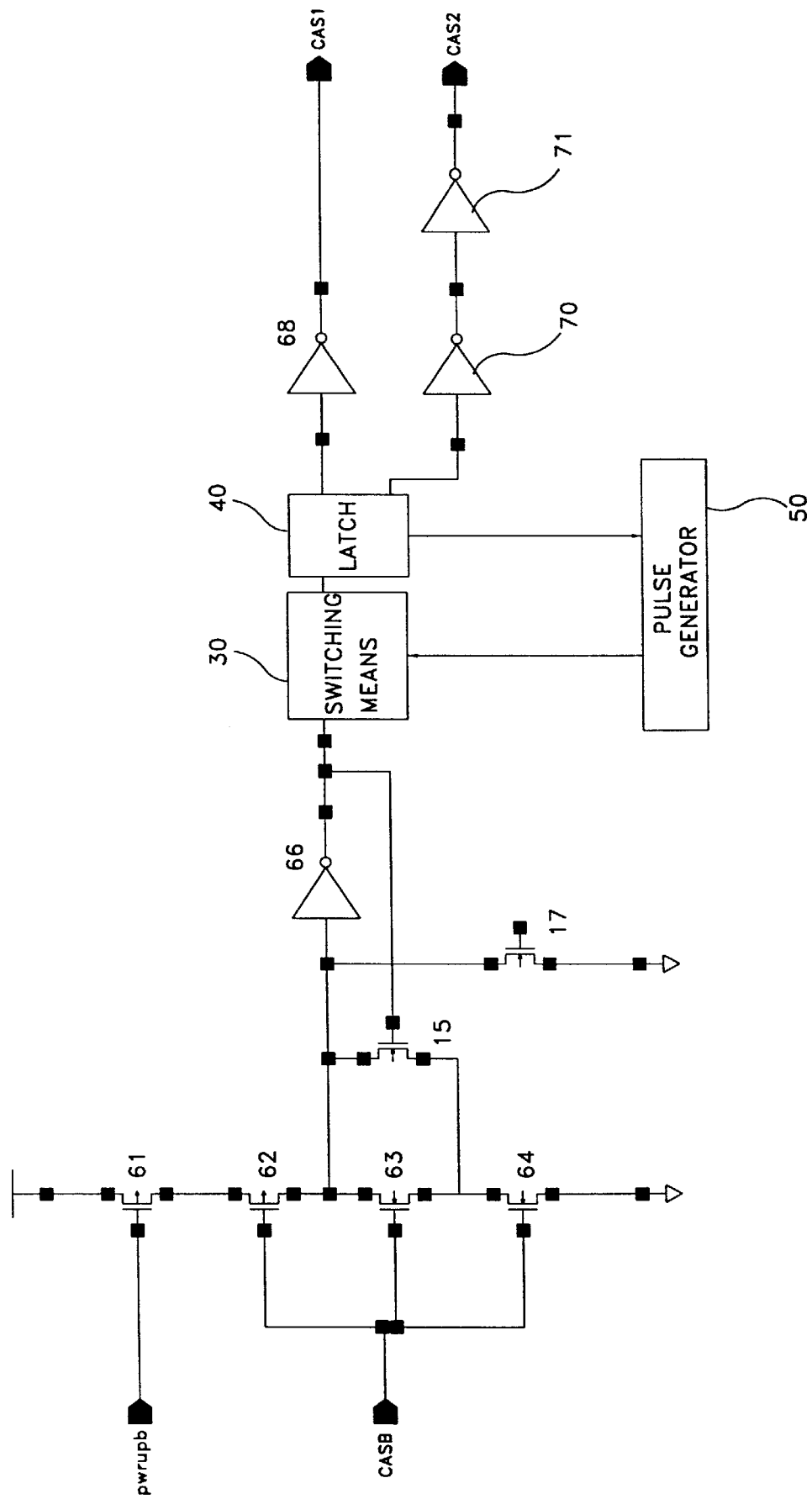
FIG. 3 is a circuit diagram of a CASB buffer of a semiconductor memory device according to the present invention.

As illustrated in FIG. 3, a column address strobe (CASB) buffer circuit of the invention includes an input means and an output means. The input means includes: a first P type MOS transistor 61 having a gate for externally receiving an inverse power-up signal pwrupb; a second P type MOS transistor 62 having a gate for externally receiving an inverse casb signal; first and second N type MOS transistors 63 and 64; and an inverting gate 66.

The output means includes: an inverting gate 68 for receiving an output signal of the inverting gate 66 and generating a first cas signal cas1; and additional inverting gates 170 and 171 for generating a second cas signal cas2.

The CASB buffer circuit additionally includes: a third N type MOS transistor 65 being connected in parallel to the first N type MOS transistor and having a gate for receiving output of the inverting gate 66; and a fourth N type MOS transistor 67 having a gate for receiving an inverse power-up signal pwrupb.

The CASB buffer circuit, where the casb signal is inputted through the inverter of the input means, and the cas1 signal is outputted through the inverting gate 68, further includes: a switching means 30 connected between the inverting gates 66 and 68 and for switching the output of the inverting gate 66 to the inverting gate 68 according to a control signal; a latch 40 for latching an output signal of the switching means 30; and a pulse generator 50 for receiving an output of the latch 40 and the inverse power-up signal pwrupb and generating the control signal to control the switching means.

The CASB buffer circuit outputs the cas1 signal at a high state through the inverting gate 68 of the output means to write data when a inverse casb signal of a low state is applied. The CASB buffer circuit prevents the cas1 signal from being converted to a high state through the switching means 30 even if the casb signal converts from the low state to the high state. Simultaneously, the CASB buffer circuit maintains the previous low state of casb signal through the latch 40, so that the cas1 signal is outputted at a high state through the inverting gate 68 for a predetermined period of time.

Figure 4:
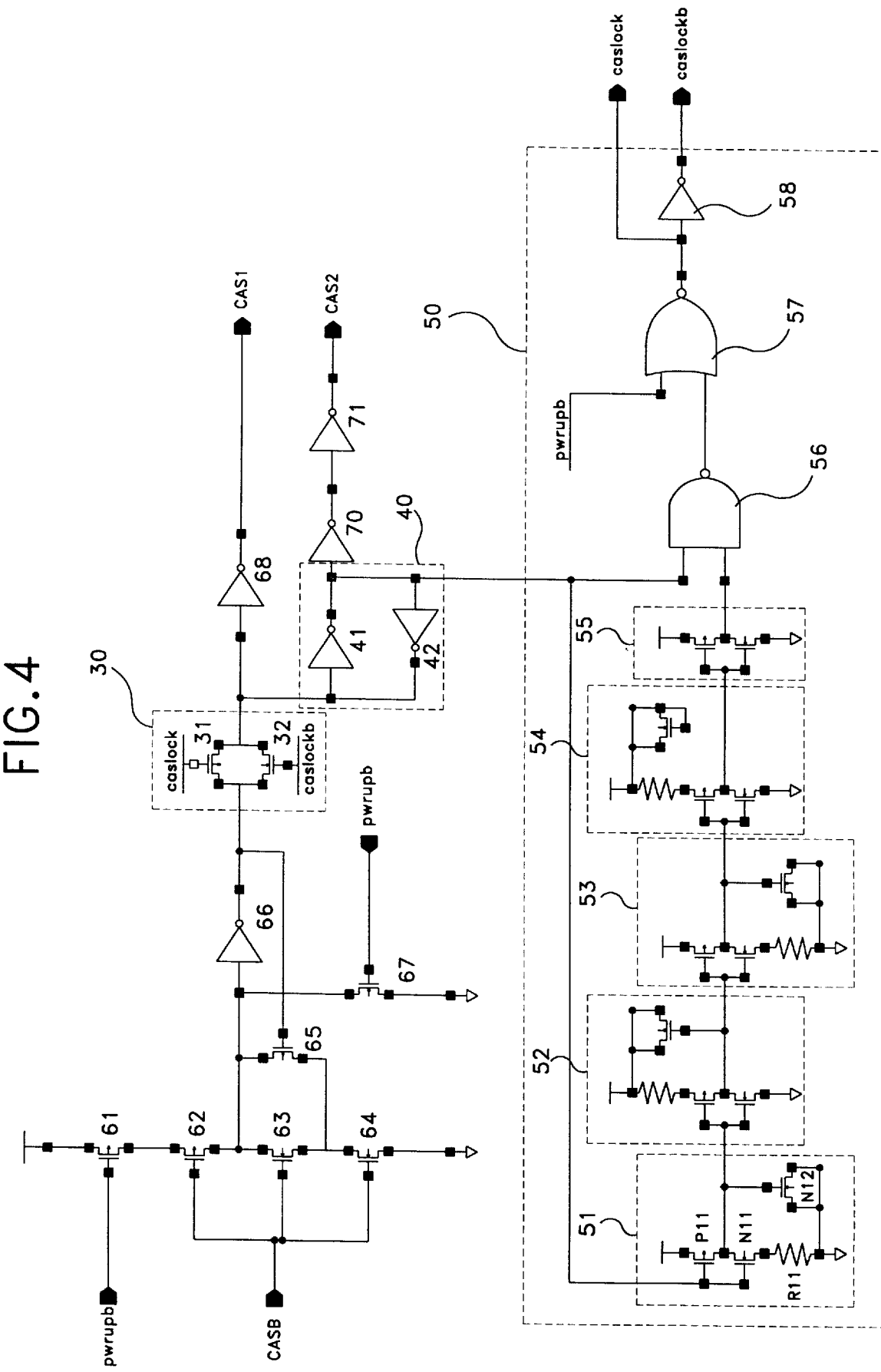
FIG. 4 is a detailed circuit diagram of the CASB buffer shown in FIG. 3.

As illustrated in FIG. 4, in the CASB buffer circuit of the invention, the switching means for transmitting the output of the inverting gate 66 as an input to the inverting gate 68, has a transmission gate 30. The transmission gate 30 includes a P type MOS transistor 31 and a N type MOS transistor 32. Each of the transistors has a gate for receiving control signals caslock and caslockb from the pulse generator 50. In the switching means 30, the output of the inverting gate 66 is not applied to the inverting gate 68 because the transmission gate 30 is turned off by the control signals caslock and caslockb applied respectively at low and high states, from the pulse generator 50, even if the casb signal is disabled to a high state before the writing operation is completed. Moreover, when the casb signal is enabled to a low state, the transmission gate is turned on by the control signals caslock and caslockb applied respectively at high and low states from the pulse generator 50, so that the output signal of the inverting gate 66 is applied to the inverting gate 68.

In the CASB buffer circuit, the latch 40 has a pair of inverting gates 41 and 42, and maintains the output signal, namely, the casb signal at a high state, of the inverting gate 66 applied through the switching means 30.

In the CASB buffer circuit of the invention, the pulse generator 50 includes a delay means for delaying the casb signal applied from the latch 40 for a predetermined time; a NAND gate 56 for receiving the output of the delay means and the casb signal applied from the latch 40, and performing a NAND operation with the output of the delay means and the casb signal applied from the latch 40; a NOR gate 57 for receiving the inverse power-up signal pwrupb and the output signal of the NAND gate 56 to perform a NOR operation and then generating the first control signal caslock to the switching means 30; and an inverting gate 58 for inverting the output of the NOR gate 57 and generating the second control signal caslockb to the switching means 30.

The delay means for delaying the high state of casb signal for a predetermined time is has first to fifth delay means, 51–55. The first to fourth delay means, each includes a CMOS inverter that includes: a P type MOS transistor P11 and N type MOS transistor N11, having a gates for receiving the casb signal applied from the latch 40; and a resistor R11 connected to the CMOS inverter. The fifth delay means 55 has a CMOS inverter, including P type and N type MOS transistors, P51 and N51. Each of the MOS transistors, P51 and N51, has a gate for receiving the output signal of the fourth delay means 54.

In the pulse generator 50, the casb signal is applied at a high state from the latch 40 is input to one input terminal of the NAND gate 56, delayed through the first and fifth delay means 51 to 55 for a predetermined time and simultaneously applied to another input terminal of the NAND gate 56. As the output of the NAND gate 56 becomes LOW and is applied to one port of the NOR gate 57, the output of the NOR gate 57 becomes HIGH and the first control signal caslock becomes HIGH. The output of the NOR gate 57 is inverted through the inverting gate 58 and the inverting gate 58 then outputs the second control signal caslockb.

With reference to the operational timing diagrams of FIGS. 5A to 5H, an operation of the CASB buffer circuit will be described below in detail.

As illustrated in FIG. 5A, when an address addr is externally applied, rasb and ras1 signals are enabled to a low state as shown in FIGS. 5B and 5C to thereby select an X-address (row address), and the casb signal is enable to a low state as shown in FIG. 5D. By the casb signal, the first P type MOS transistor 62 is turned on, so that the output of the inverting gate 66 becomes LOW. The inverting gate 66 is applied at a low state to the inverting gate 68 through the transmission gate, and the cas1 signal outputted through the inverting gate 68 becomes HIGH as shown in FIG. 5F.

Here, the casb signal outputted at a high state through the first inverter 41 is applied to one input terminal of the NAND gate 56 in the pulse generator 50, delayed through the first to fifth delay means 51 to 55 and then applied to another input terminal of the NAND gate 56.

The output of the NAND gate 56 is applied at a low state to the NOR gate 57, so that the control signal caslock becomes HIGH. The inverting gate 58 inverts the output of the NOR gate 57 and outputs the second control signal caslockb at a low state. Therefore, when the casb signal is enabled to a low state, it is applied to a pulse generator 50 through the latch 40. The pulse generator 50 applies the first and second control signals caslock and caslockb, at high and low states respectively, to the switching means 30.

The transmission gate of the switching means 30 is turned off by the first and second control signals caslock and caslockb applied at high and low states, respectively, from the pulse generator 50. After the cas1 signal is output at a high state from the inverter 68 receiving the casb signal at a low state, the switching means 30 is turned off by the control signals caslock and caslockb applied from the pulse generator 50, so that the casb signal applied to the inverting gate 68 is cut off.

At the same time, as the casb signal is prevented from being applied to the inverting gate 68 by the switching means 30, and the casb signal previously applied at a low state through the transmission gate of the switching means 30 is maintained at the low state through the latch 40 for a predetermined period of time, so that the cas1 signal is maintained at the high state, thereby performing the writing operation.

To perform the writing operation, a enable signal web becomes active LOW as shown in FIG. 5G, and we1 signal becomes HIGH as illustrated in FIG. 5H. When the we1 signal becomes HIGH, data applied to the designated address is written.

In case the casb signal is disabled to a high state as shown by the dotted line of FIG. 5D during the writing operation, the transmission gate of the switching means 30 is turned off by the control signals caslock and caslockb generated in the pulse generator 50, so that the casb signal is not applied at a high state to the inverting gate 68. In other words, even though the casb signal is disabled to a high state during the data writing operation, the switching means 30 cuts off the transmission of the casb signal at a high state to the inverting gate 68 by the first and second control signals, caslock and caslockb, and the latch means 40 maintains the casb signal at a low state. Consequently, the transmission of the casb signal does not affect the writing operation.

After a predetermined time td, the output of the NAND gate 56 becomes HIGH and is applied to the NOR gate 57 to thereby output the first control signal caslock at a low state, and the inverting gate 58 outputs the second control signal caslockb at a high state. When the predetermined time td has elapsed after the casb signal has been applied at a low state, the control signals caslock and caslockb are applied at low and high states, respectively, to the switching means through the pulse generator 50, so that the transmission gate of the switching means 30 is turned on. As the transmission gate of the switching means 30 is turned on, the casb signal is applied at a high state to the inverting gate 18, resulting in the cas1 signal being converted to a low state. As the cas1 signal becomes LOW, the writing enable signal we1 is converted to a low state and the writing operation is completed.

As described above, the CASB buffer circuit of the invention enables the cas1 to a high state according to the casb signal, and controls the we1 signal to be HIGH by the cas1 signal at a high state to thereby perform the writing operation.

Even in the case of the casb signal being converted to a HIGH state during the writing operation due to the narrow pulse width of the casb signal, the switching means 30, controlled by the control signal from the pulse generator 50, cuts off the transmission of the casb signal before the predetermined time td ends, and the casb signal is maintained at the previous low state for a predetermined time td by the latch. Therefore, even though the casb signal with a narrow pulse is applied, the low state of casb signal is maintained for the predetermined time td for the writing operation. After the writing operation is fully performed, the we1 signal is converted into the LOW state.

The CASB buffer circuit of the invention cuts off the transmission of the casb signal at a high state by operating the switching means 30 for a predetermined time when the casb signal is converted from the low state to the high state due to the narrow pulse width of the casb signal during the writing operation. At the same time, the CASB buffer circuit maintains the high state of the cas1 signal for a predetermined time, and the we1 signal is converted into the low state after fully performing the writing operation until the operation is completed. On the other hand, if the pulse of the casb signal is of a sufficient duration to fully perform the writing operation, the invention is controlled directly by the casb signal. In this case, at the moment that the casb signal is converted to the high state, the we1 signal is converted into the low state.

According to the above described present invention, in the case where the casb signal has a narrow pulse width wherein the casb signal returns to a high state during the writing operation, the CASB buffer circuit cuts off the transmission of the casb signal at a high state, and simultaneously, maintains the casb signal at its previous low state through the latch 40. Therefore, the we1 signal is converted into the low state only after the writing operation is completely performed regardless of the length of the pulse width. Consequently, writing error due to the casb signal can be prevented and data writing operation can be properly performed through the present invention.

It will be apparent to those skilled in the art that various modifications and variations can be made in the CAS buffer of the semiconductor memory device of the present invention without departing from the spirit or scope of the invention. Thus, it is intended that the present invention cover the modifications and variations of this invention provided they come within the scope of the appended claims and their equivalents.

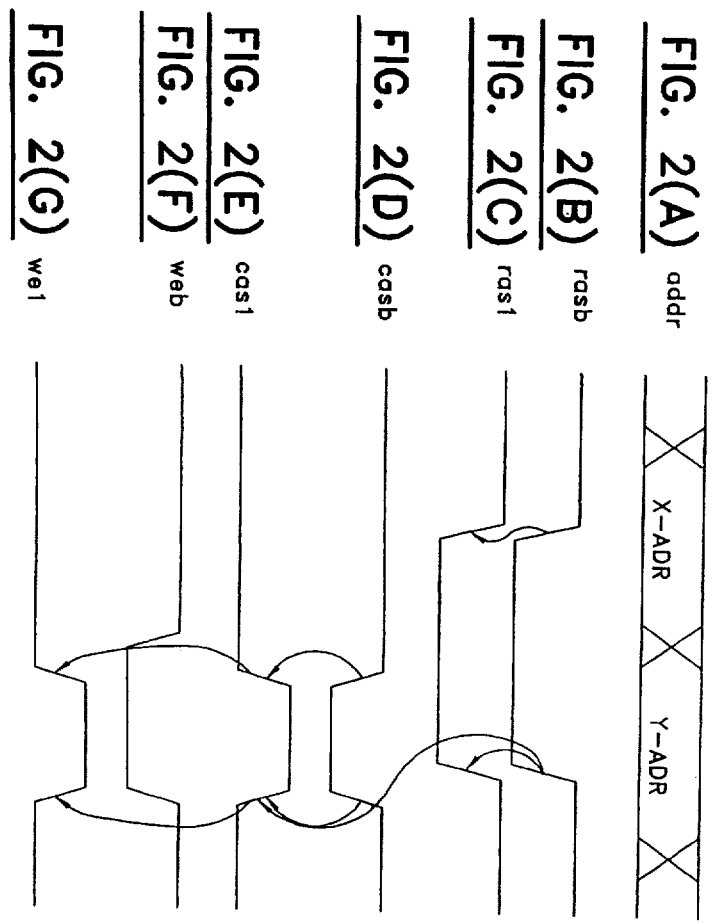

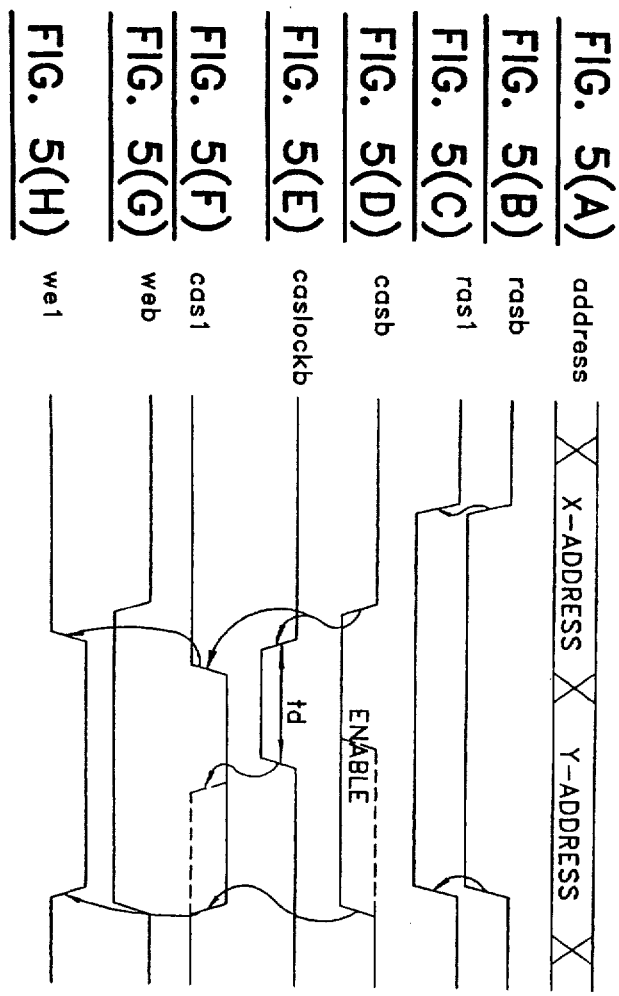

What is claimed is:

1. A buffer circuit of a semiconductor memory device having input means for receiving an input signal externally applied by an external control signal and output means for outputting the input signal of the input means as a writing control signal through an output means, comprising:

a switching means connected to the input means for switching a signal transmission from the input means to the output means according to first and second internal control signals;

a latch means for latching an output signal from the switching means; and a pulse generator for receiving the output signal of the latch means and the external control signal and outputting the first and second internal control signals for controlling the switching means.

2. The buffer circuit as claimed in claim 1, wherein the switching means has a transmission gate comprising a P type MOS transistor and an N type MOS transistor respectively having gates for receiving the first and second internal control signals applied from the pulse generator, respectively.

3. The buffer circuit as claimed in claim 1, wherein the pulse generator comprises:

delay means for delaying an output signal of the latch means for a predetermined time;

a NAND gate for receiving the output signals of the delay means and latch means and performing a NAND operation;

a NOR gate for receiving the external control signal and the output signal of the NAND gate to perform a NOR operation, and generating the first internal control signal to the switching means; and an inverting gate for inverting the output of the NOR gate and generating the second control signal to the switching means.

* * * * *

UNITED STATES PATENT AND TRADEMARK OFFICE
CERTIFICATE OF CORRECTION

PATENT NO : 6,122,202
DATED : September 19, 2000
INVENTOR(S): C. Jeong

Figure 1:
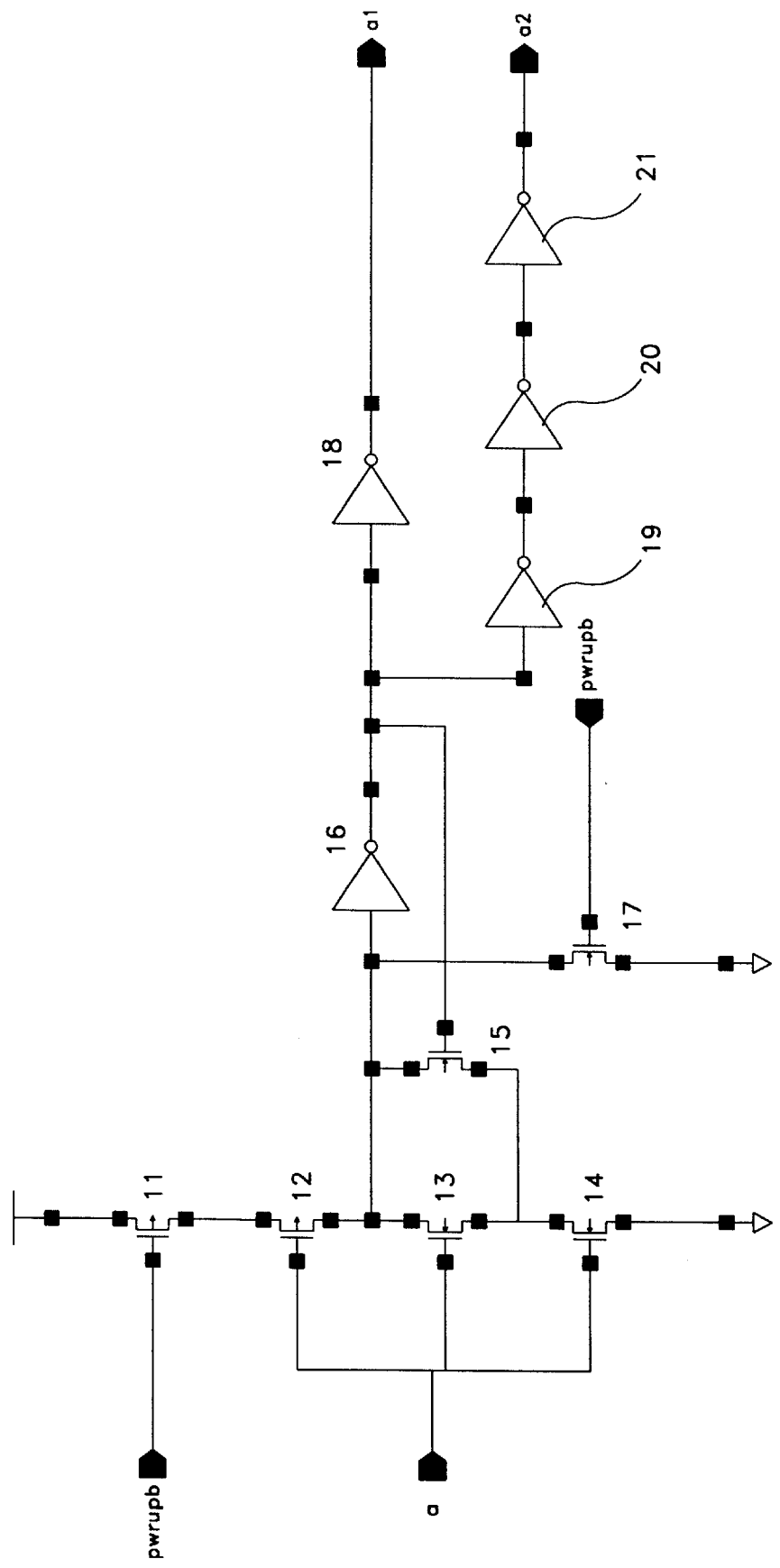
FIG. 1 is a circuit diagram of a conventional CASB buffer of a semiconductor memory device.
Figure 2:
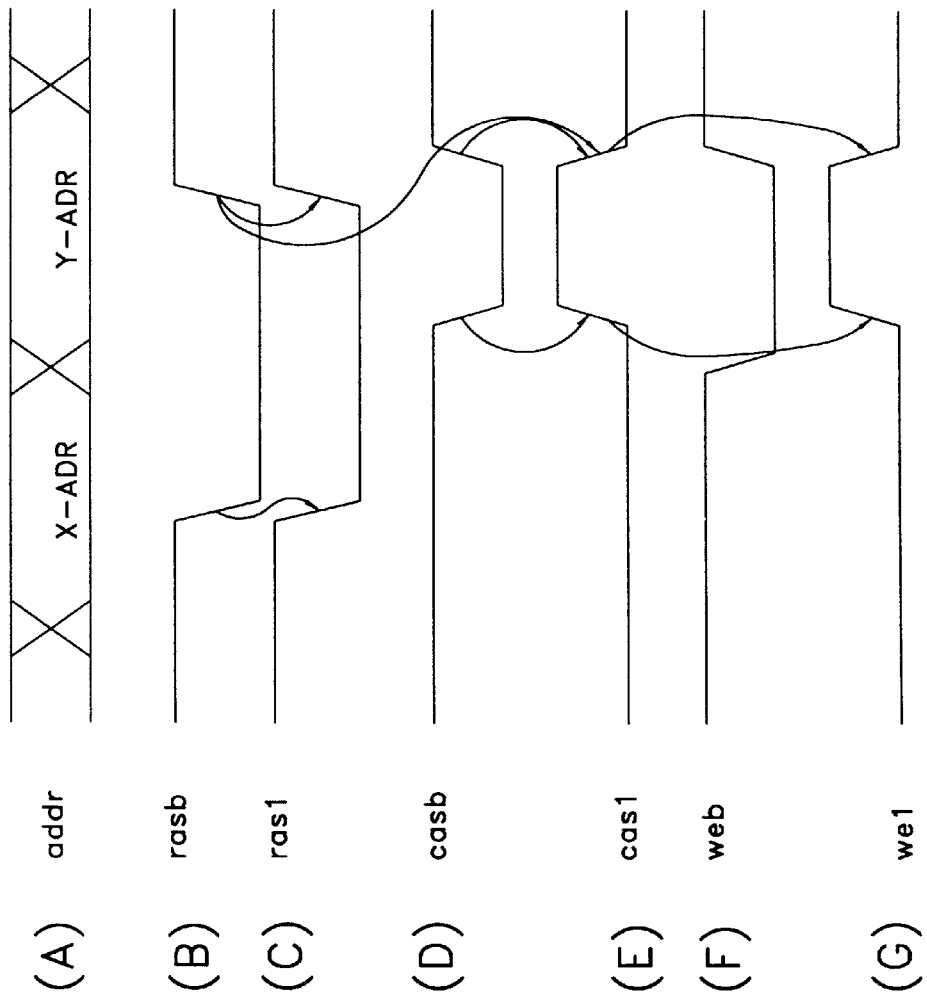
FIGS. 2A to 2G are operational timing diagrams of the conventional CASB buffer of a semiconductor memory device.

It is certified that error appears in the above-identified patent and that said Letters Patent are hereby corrected as shown below:

Please cancel Figs. 2 and 5 and substitute the enclosed therefor.

At col. 1, line 26, after "outputting a", please cancel "casb" and substitute --cas1-- therefor.

Signed and Sealed this

Fifteenth Day of May, 2001

Attest:

NICHOLAS P. GODICI

Attesting Officer     Acting Director of the United States Patent and Trademark Office